United States Patent
De Santis

(10) Patent No.: US 11,062,785 B2
(45) Date of Patent: *Jul. 13, 2021

(54) APPARATUS FOR DETERMINING AN EXPECTED DATA AGE OF MEMORY CELLS

(71) Applicant: MICRON TECHNOLOGY, INC., Boise, ID (US)

(72) Inventor: Luca De Santis, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/839,304

(22) Filed: Apr. 3, 2020

(65) Prior Publication Data
US 2020/0234777 A1   Jul. 23, 2020

Related U.S. Application Data

(63) Continuation of application No. 16/161,230, filed on Oct. 16, 2018, now Pat. No. 10,629,280.

(51) Int. Cl.
*G11C 16/26* (2006.01)
*G11C 16/04* (2006.01)
*G11C 16/34* (2006.01)
*G11C 11/56* (2006.01)

(52) U.S. Cl.
CPC ............ *G11C 16/349* (2013.01); *G11C 16/26* (2013.01); *G11C 11/5642* (2013.01); *G11C 11/5671* (2013.01); *G11C 16/04* (2013.01); *G11C 16/0483* (2013.01); *G11C 16/34* (2013.01); *G11C 16/3495* (2013.01)

(58) Field of Classification Search
CPC ... G11C 16/349; G11C 16/26; G11C 11/5642; G11C 11/4571; G11C 16/0483
USPC ..................................................... 365/185.18
See application file for complete search history.

(56) References Cited

U.S. PATENT DOCUMENTS

| | | | |
|---|---|---|---|
| 7,787,307 B2 | 8/2010 | Sarin | |
| 8,943,386 B1 * | 1/2015 | Lee | G06F 11/076 714/763 |
| 9,230,688 B2 | 1/2016 | Yanamanamanda et al. | |
| 10,283,205 B2 | 5/2019 | Malshe et al. | |
| 10,347,344 B2 | 7/2019 | Malshe et al. | |
| 2011/0026539 A1 * | 2/2011 | Rojas-Cessa | H04L 49/1515 370/412 |

(Continued)

*Primary Examiner* — Ly D Pham
(74) *Attorney, Agent, or Firm* — Dicke, Billig & Czaja, PLLC

(57) ABSTRACT

Apparatus including an array of memory cells, a plurality of access lines each corresponding to a respective plurality of memory cells of the array of memory cells and each connected to a control gate of each memory cell of its respective plurality of memory cells; and a controller for access of the array of memory cells that is configured to cause the apparatus to apply a particular voltage level to a particular access line of the plurality of access lines, and determine a value indicative of a number of memory cells of the respective plurality of memory cells for the particular access line that are activated in response to applying the particular voltage level. The controller might further be configured to determine an expected data age of the respective plurality of memory cells, and/or determine a plurality of read voltages for reading the respective plurality of memory cells.

26 Claims, 13 Drawing Sheets

(56) References Cited

U.S. PATENT DOCUMENTS

2017/0364275 A1  12/2017  Natarajan et al.

* cited by examiner

APPARATUS FOR DETERMINING AN EXPECTED DATA AGE OF MEMORY CELLS

RELATED APPLICATIONS

This Application is a Continuation of U.S. application Ser. No. 16/161,230, titled "APPARATUS AND METHODS FOR DETERMINING AN EXPECTED DATA AGE OF MEMORY CELLS" filed Oct. 16, 2018, issued as U.S. Pat. No. 10,629,280 on Apr. 21, 2020, which is commonly assigned and incorporated herein by reference. This patent application is related to U.S. patent application Ser. No. 16/161,256 titled "APPARATUS AND METHODS FOR DETERMINING AN EXPECTED DATA AGE OF MEMORY CELLS" filed Oct. 16, 2018, which is commonly assigned.

TECHNICAL FIELD

The present disclosure relates generally to memory and, in particular, in one or more embodiments, the present disclosure relates to apparatus and methods for determining an expected data age of memory cells, which can be used in the determination of data states of those memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5 V or higher might indicate a programmed memory cell (e.g., representing a logical 0) while a Vt of −0.5 V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is activated in response to a particular voltage applied to its control gate, such as by detecting whether a data line connected to the memory cell experiences a change in voltage level caused by current flow through the memory cell. Memory relying on levels of stored charge to define different Vt ranges are often subject to charge loss over time, resulting in shifting and spreading of the Vt ranges. This can lead to an inaccurate determination of the data state of a sensed memory cell due to the change of its Vt over time.

DETAILED DESCRIPTION

Figure 1:
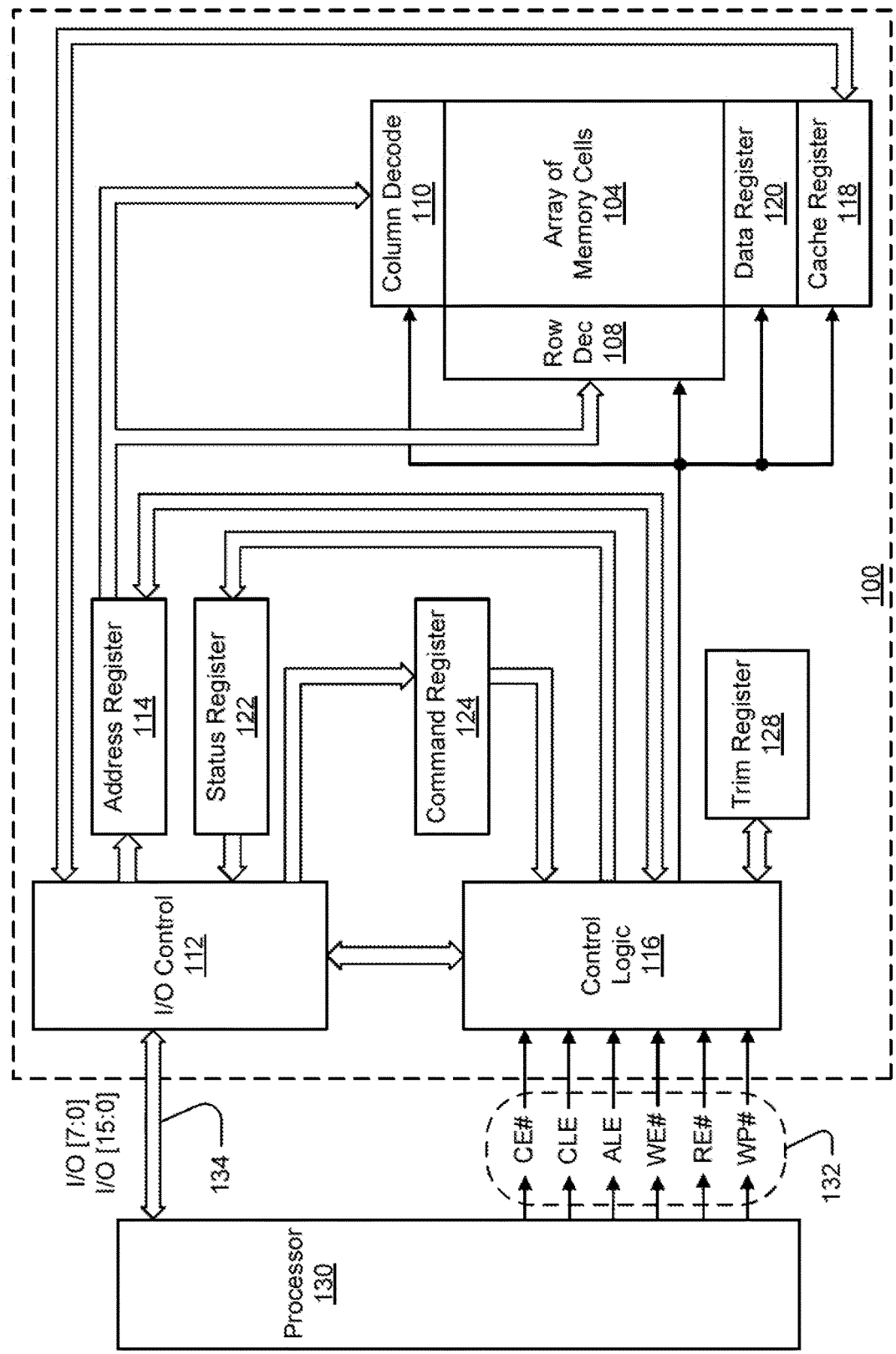
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 128 may be in communication with the control logic 116. The trim register 128 might represent a volatile memory, latches or other storage location, volatile or non-volatile. For some embodiments, the trim register 128 might represent a portion of the array of memory cells 104. The trim register 128 might store information relating to the determination of an expected data age of memory cells, and/or the determination of read voltages, in accordance with embodiments. The control logic 116 might be configured to perform methods of operating a memory in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120.

Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
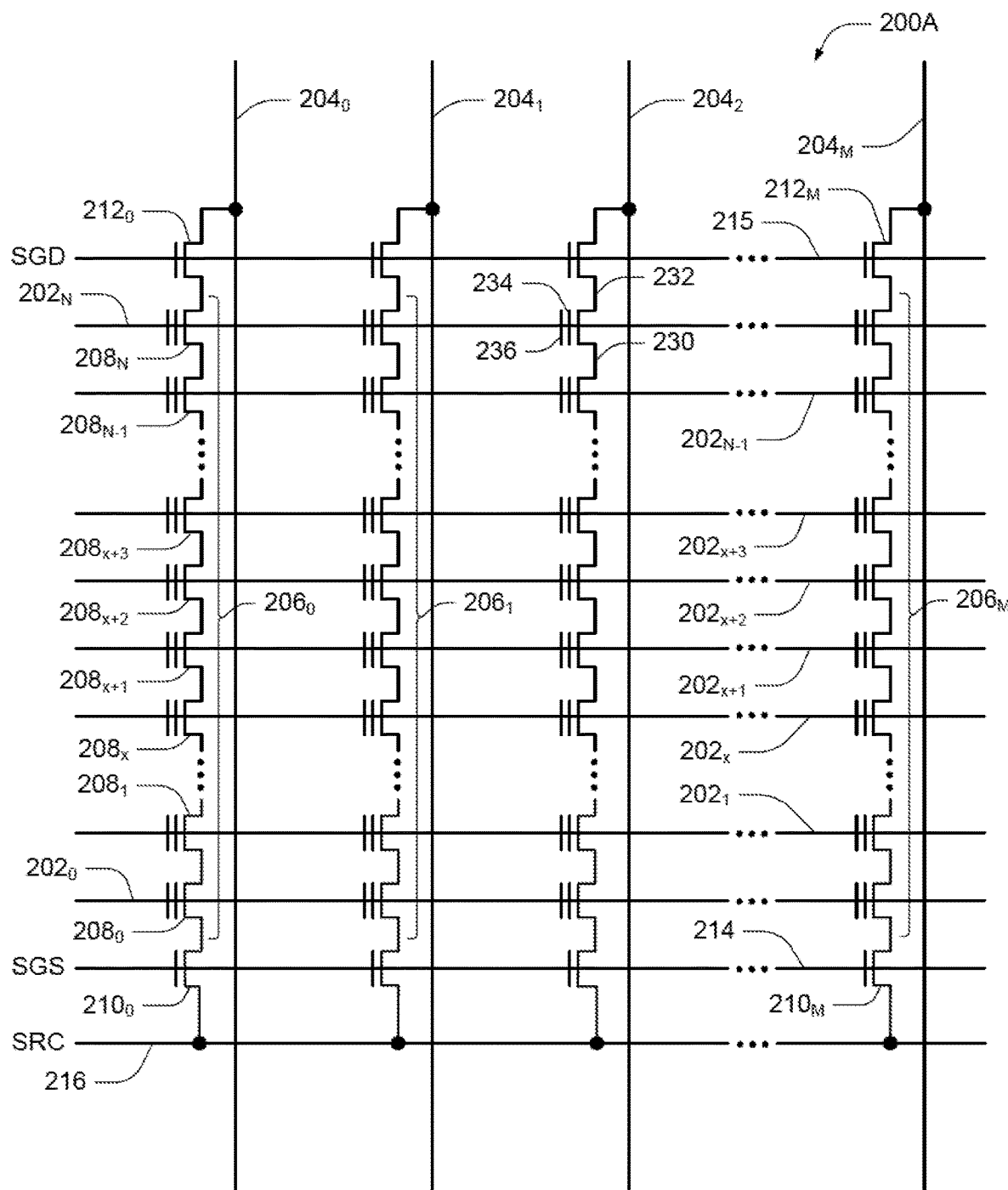
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
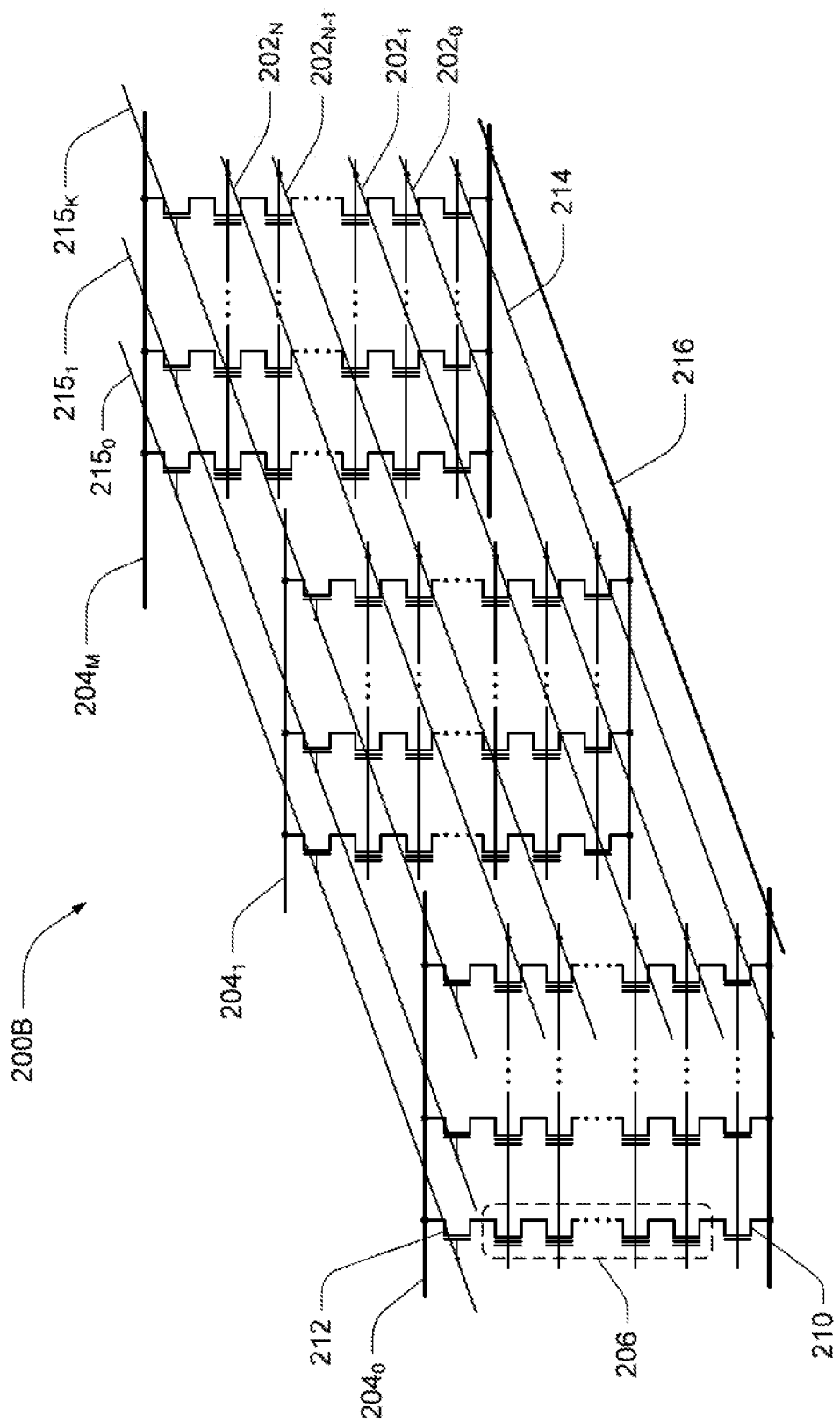

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
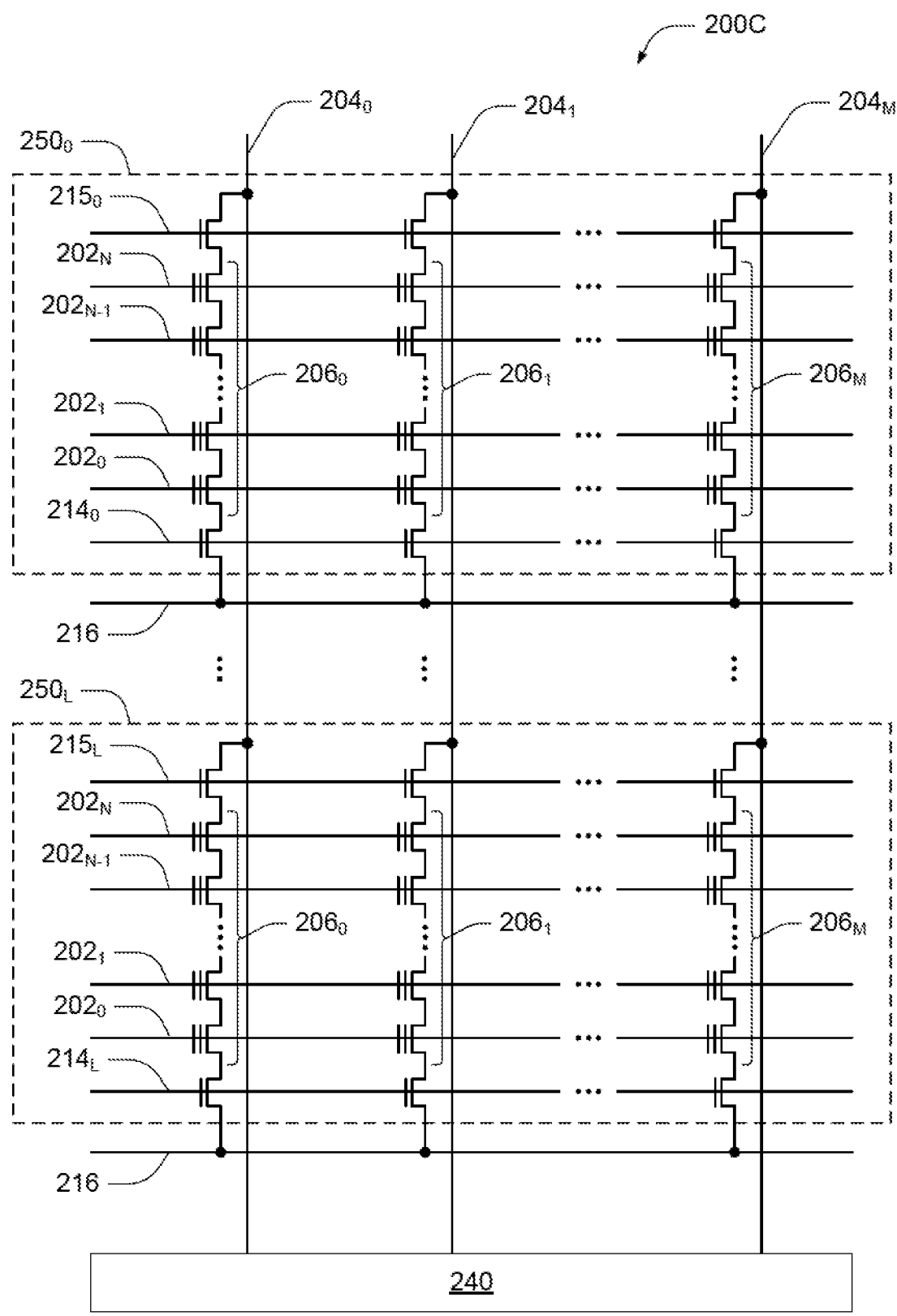

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sensing devices (not shown) for sensing data values indicated on respective data lines 204, and corresponding registers (not shown) for storage of the sensed data values from its corresponding memory plane.

Figure 3:
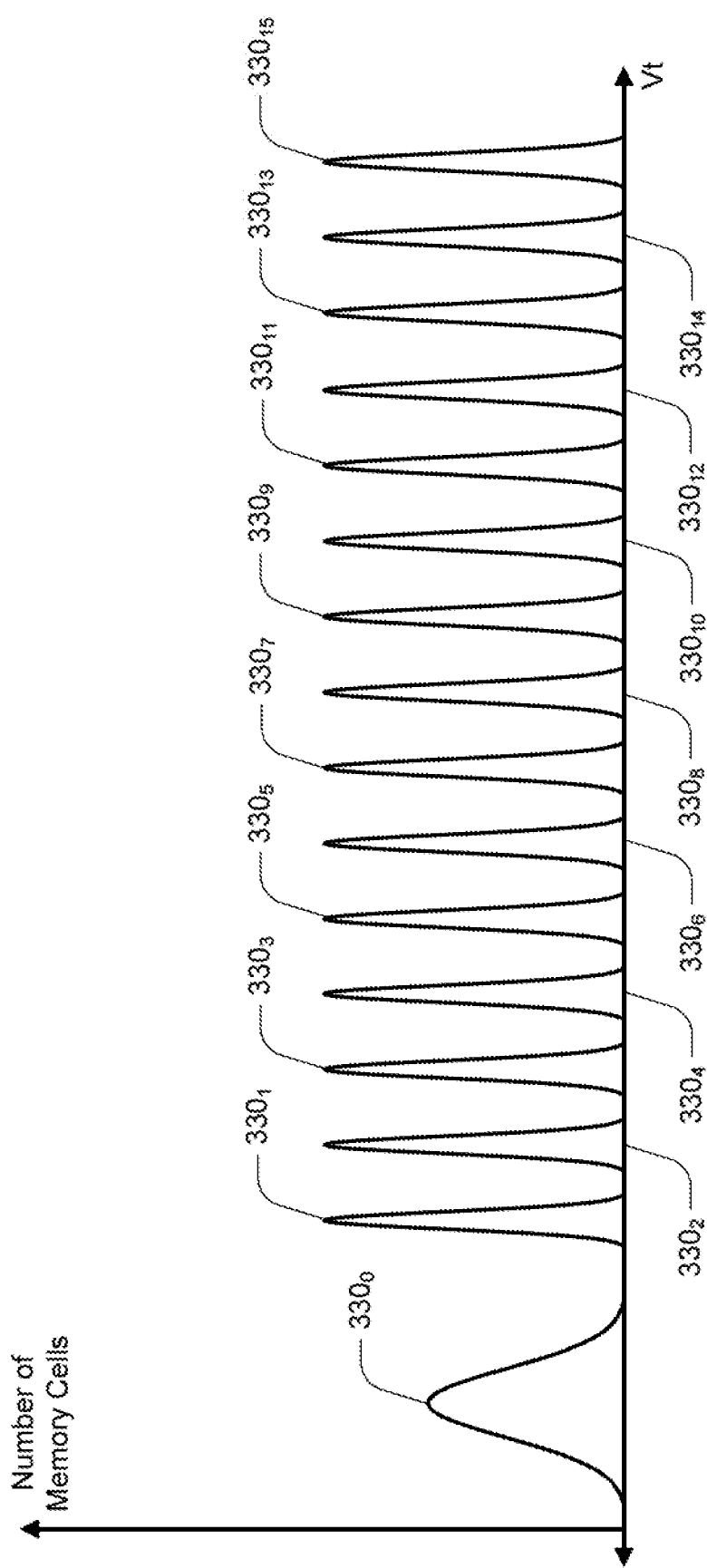
FIG. 3 is a conceptual depiction of threshold voltage distributions of a plurality of memory cells.

FIG. 3 is a conceptual depiction of threshold voltage ranges of a plurality of memory cells. FIG. 3 illustrates an example of threshold voltage ranges and their distributions for a population of a sixteen-level memory cells, often referred to as QLC memory cells. For example, such a memory cell might be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ may tend to have tighter distributions.

The threshold voltage ranges $330_0$, $330_1$, $330_3$, $330_4$, $330_5$, $330_6$, $330_7$, $330_8$, $330_9$, $330_{10}$, $330_{11}$, $330_{12}$, $330_{13}$, $330_{14}$ and $330_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case may be storing a data state L0 having a data value of logical '1111' and is typically referred to as the erased state of the memory cell. If the threshold voltage is within the second of the sixteen threshold voltage ranges $330_1$, the memory cell in this case may be storing a data state L1 having a data value of logical '0111'. If the threshold voltage is within the third of the sixteen threshold voltage ranges $330_2$, the memory cell in this case may be storing a data state L2 having a data value of logical '0011', and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state. The information of Table 1 might be contained within the trim register 128, for example.

TABLE 1

| Data State | Logical Data Value |
| --- | --- |
| L0 | 1111 |
| L1 | 0111 |
| L2 | 0011 |
| L3 | 1011 |
| L4 | 1001 |

TABLE 1-continued

| Data State | Logical Data Value |
|---|---|
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

As memory cells are reduced in size, their associated data storage structures generally become smaller. In addition, as more levels of data states are stored to memory cells, differentiation between data states may become more difficult.

Threshold voltages of memory cells may shift due to such phenomena as quick charge loss (QCL). QCL is a de-trapping of electrons near a gate dielectric interface out to the channel region of the memory cell, and can cause a Vt shift shortly after a programming pulse. When a memory cell passes the verify operation, the programmed threshold voltage may appear to be higher due to the trapped charge in the gate dielectric. When the memory cell is read after the program operation has been completed, the memory cell may have a Vt that is lower than the Vt obtained during the program verify operation due to the charge in the gate dielectric leaking out to the channel region.

Threshold voltages of memory cells may further shift due to cumulative charge loss over the age of their programmed data, e.g., a period of time between programming the data and reading the data, referred to herein as data age. Such charge loss can become more pronounced as the data storage structures become smaller. This can make accurate determination of data states more difficult as the threshold voltage of a memory cell may shift enough to place it in the threshold voltage range of a target data state that is two or more levels lower than its original target data state. Various embodiments provide apparatus and methods that may facilitate a mitigation of these concerns.

Charge loss resulting from data age might be predictable, and may generally exhibit an exponential decay function. As a result, expected Vt ranges for memory cells having a known data age might be determinable. Various embodiments seek to determine an expected data age of memory cells, which can thus provide guidance with regard to read voltages that should be used when determining the intended data states of those memory cells.

Figure 4A:
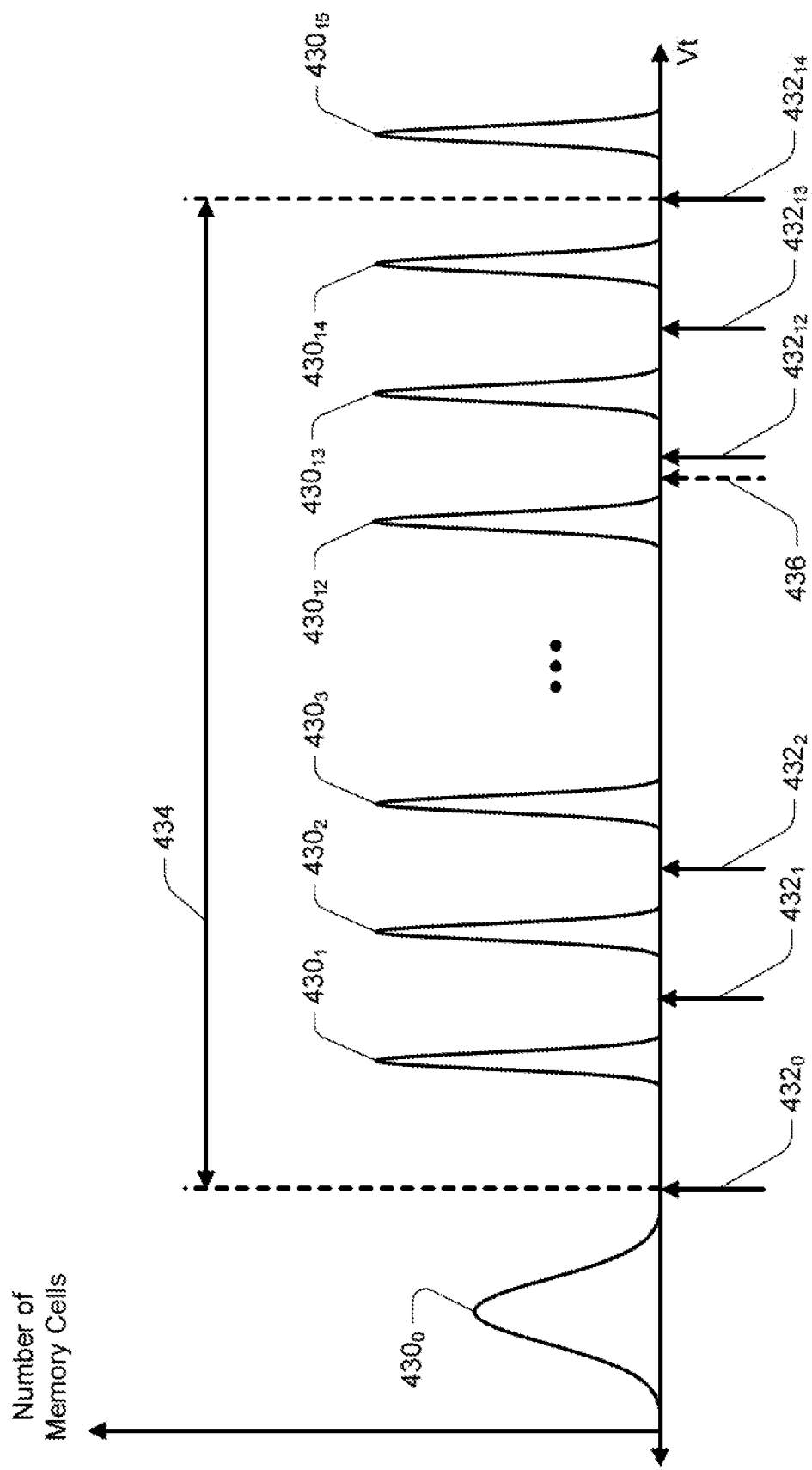
FIGS. 4A-4B are conceptual depictions of threshold voltage distributions of a plurality of memory cells in accordance with an embodiment.
Figure 4B:
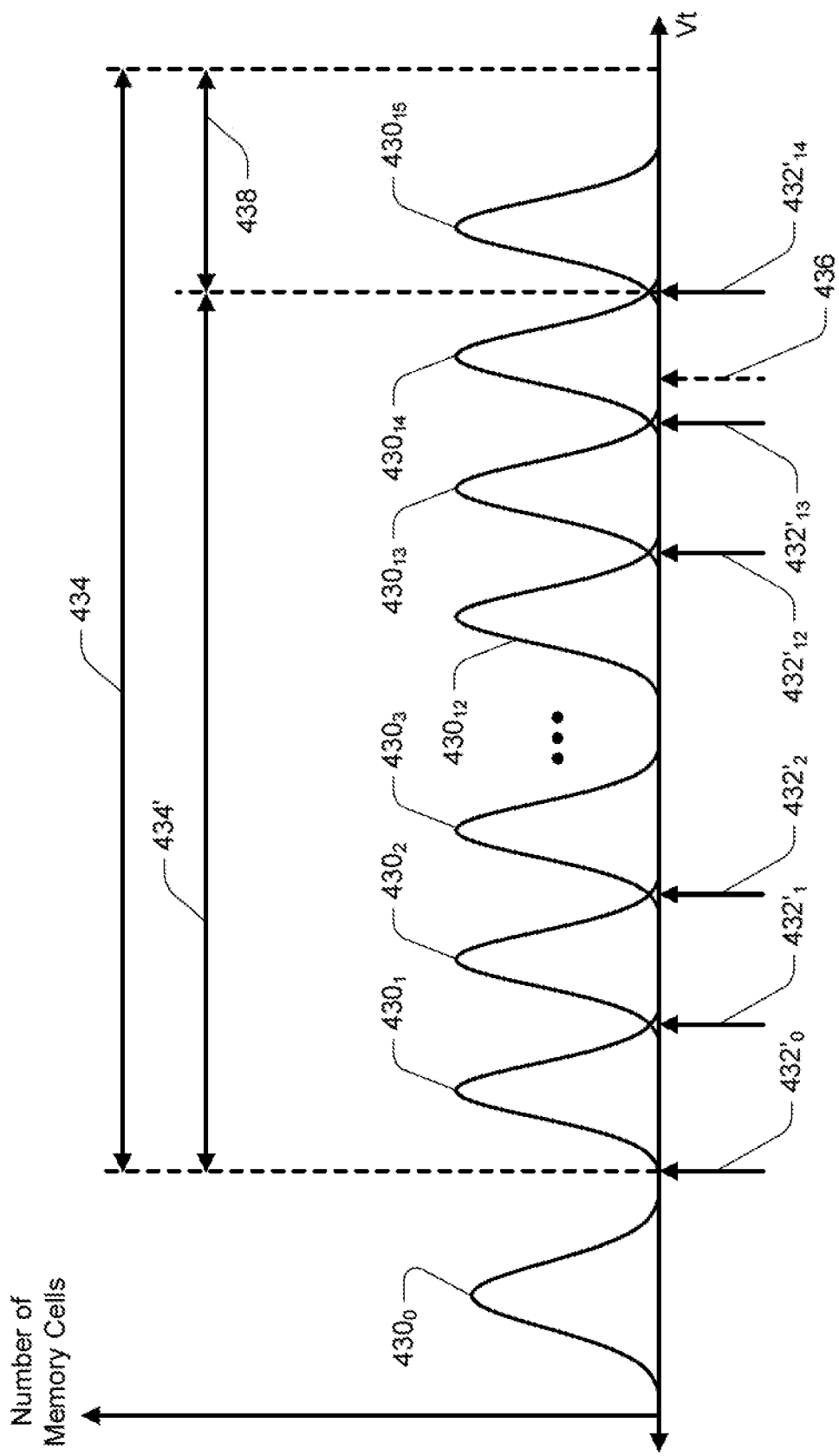

FIGS. 4A-4B are conceptual depictions of threshold voltage distributions of a plurality of memory cells in accordance with an embodiment. The threshold voltage ranges $430_0$-$430_{15}$ of FIG. 4A might correspond to the threshold voltage ranges $330_0$-$330_{15}$ of FIG. 3 at a first data age, while the threshold voltage ranges $430_0$-$430_{15}$ of FIG. 4B might correspond to the threshold voltage ranges $330_0$-$330_{15}$ of FIG. 3 at a second data age, higher than the first data age.

In determining the data states of the memory cells of the various distributions of FIG. 4A, read voltages $432_0$-$432_{14}$ might be used. For example, where the read voltages 432 are applied in increasing order, memory cells first activating in response to the read voltage $432_0$ might be determined to have the data state corresponding to the threshold voltage range $430_0$, memory cells first activating in response to the read voltage $432_1$ might be determined to have the data state corresponding to the threshold voltage range $430_1$, memory cells first activating in response to the read voltage $432_2$ might be determined to have the data state corresponding to the threshold voltage range $430_2$, and so on. Memory cells that do not activate in response to any of the read voltages $432_0$-$432_{14}$ might be deemed to have the data state corresponding to the threshold voltage range $430_{15}$. The voltage range between the highest read voltage and the lowest read voltage of the read operation might represent a read window 434. Immediately subsequent to programming the memory cells, the read window 434, e.g., an initial read window, might be approximately 6 V, and range from −1 V to 5 V, for example.

In determining the data states of the memory cells of the various distributions of FIG. 4B, read voltages $432'_0$-$432'_{14}$ might be used. For example, where the read voltages 432' are applied in increasing order, memory cells first activating in response to the read voltage $432'_0$ might be determined to have the data state corresponding to the threshold voltage range $430_0$, memory cells first activating in response to the read voltage $432'_1$ might be determined to have the data state corresponding to the threshold voltage range $430_1$, memory cells first activating in response to the read voltage $432'_2$ might be determined to have the data state corresponding to the threshold voltage range $430_2$, and so on. Memory cells that do not activate in response to any of the read voltages $432'_0$-$432'_{14}$ might be deemed to have the data state corresponding to the threshold voltage range $430_{15}$. In the example of FIG. 4B, threshold voltage distributions for the various data states are depicted as overlapping due to spreading that often occurs as a result of charge loss. While some memory cells that were originally programmed to have a particular data state, e.g., the data state corresponding to the threshold voltage range $430_2$, might be erroneously deemed to have the next lower or next higher data state, e.g., the data states corresponding to the threshold voltage ranges $430_1$ and $430_3$, respectively, error correction might be used to correct these errors as is well understood in the relevant art.

The read window 434' of FIG. 4B, as a result of the shifting of the threshold voltage ranges 430, might be smaller than the read window 434 of FIG. 4A. For example, after five time decades, the read window 434' might be approximately 5 V, and range from −1 V to 4 V, for example. As a result, the set of read voltages $432'_3$-$432'_{14}$ of FIG. 4B would generally need to be different than the set of read voltages $432_0$-$432_{14}$ of FIG. 4A in order to more accurately determine the intended data states of the memory cells. Time decades are defined such that X time decades equals $10^X$ seconds, e.g., 0 time decades equals 1 second, 1 time decade equals 10 seconds, 2 time decades equals 100 seconds, etc.

Desired read voltages as a function of data age (e.g., the slope of a line, the constants of a polynomial or other characterization) might be determined empirically, based on knowledge of the structure and materials of the memory cells, or directly through experimentation. For example, various data states (e.g., a pseudo-random distribution) might be programmed to a group of memory cells, and the resulting threshold voltages can be determined at different data ages. A composite function could be fitted from the individual responses of these memory cells. A function could be determined for a memory array as a whole, or individual functions might be determined on some sub-portion of the memory array, e.g., by block of memory cells.

It is proposed that a number memory cells of the programmed memory cells that activate in response to a given read voltage can be used to indicate an expected data age of the programmed memory cells. Generally, a page of memory cells will be programmed with a distribution of data values that approaches a random distribution, often by design. As such, it might be assumed that there would be an equal number of memory cells programmed to each of the possible target data states. If an intermediate read voltage, i.e., a read voltage having a voltage level between the highest voltage level and the lowest voltage level of the read window at the time of programming, is applied to an access line connected to a group of memory cells (e.g., a page of memory cells), the number of memory cells activating in response to that intermediate read voltage might be determined. Consider the example of the intermediate read voltage 436 being applied to a group of memory cells having the data age of FIG. 4A. The number of memory cells activated in response to the intermediate read voltage 436 might be expected to be 13/16, or approximately 81%, of the group of memory cells, i.e., the memory cells of the distributions of FIG. 4A for each of the sixteen target data states. However, if that same intermediate read voltage 436 is applied to that group of memory cells having the data age of FIG. 4B, the number of memory cells activated in response to that intermediate read voltage 436 might be expected to be in excess of 14/16, or in excess of approximately 88%, of the group of memory cells. While discussed in this example as a fraction or percentage of the group of memory cells, any other representation of the number of activated memory cells might be used, such as an integer value. Accordingly, this number of activated memory cells for an intermediate read voltage of a particular voltage level might be used to determine an expected data age of the group of memory cells. Note that although the intermediate read voltage 436 was depicted as being a voltage level other than any of the read voltages 432, the intermediate read voltage 436 could alternatively have a voltage level equal to the voltage level of one of the read voltages 432. In addition, the intermediate read voltage 436 might have a voltage level that is in the upper half of the read window 434, e.g., an initial read window. The intermediate read voltage 436 might have a voltage level that is in the upper quarter of the read window 434, e.g., an initial read window. For some embodiments, the intermediate read voltage 436 might have a voltage level within a range of a lowest voltage level of the initial read window plus 0.70-0.95 times the width of the initial read window. For example, where the initial read window ranges from −1 V to 5 V, the intermediate read voltage 436 might have a voltage level within the range of −1 V+0.70*(5 V−(−1 V)) to −1 V+0.95*(5 V−(−1 V)), or 3.2 V to 4.7 V.

Figure 5:
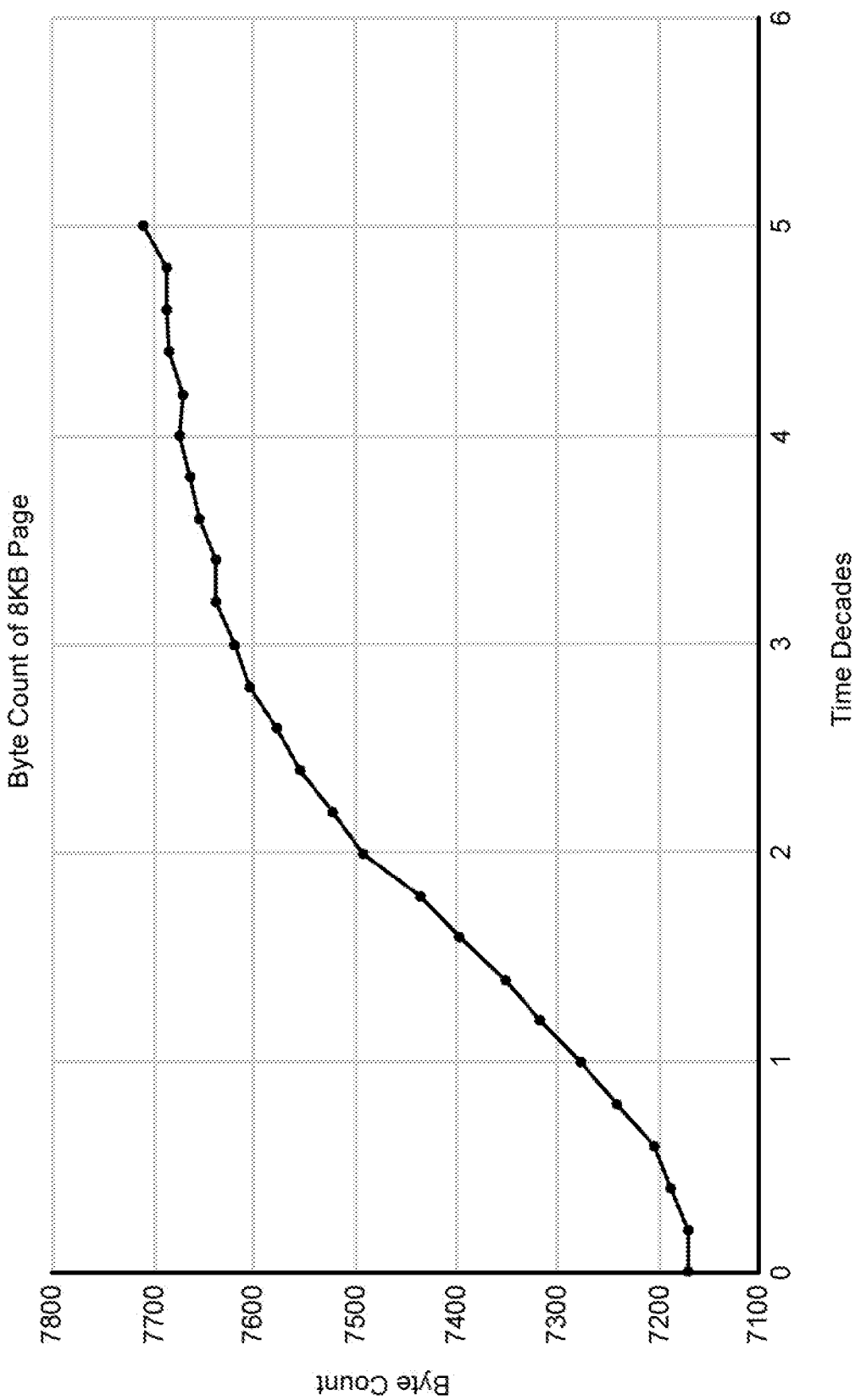
FIG. 5 is a graph showing a hypothetical assumed relationship between data age of a group of memory cells and a number of memory cells activated in response to a particular read voltage in accordance with an embodiment.

FIG. 5 is a graph showing a hypothetical relationship between data age of a group of memory cells and a number of memory cells activated in response to a particular read voltage in accordance with an embodiment. The relationship between data age and the number of memory cells activated in response to a particular intermediate read voltage (e.g., the slope of a line, the constants of a polynomial or other characterization) might be determined empirically, based on knowledge of the structure and materials of the memory cells, or directly through experimentation. For example, various data states (e.g., a pseudo-random distribution) might be programmed to a group of memory cells, e.g., during factory testing or periodically or intermittently during use, and the number of memory cells activated in response to a particular intermediate read voltage can be determined at different data ages. The example of FIG. 5 was generally developed through simulation of the reading of a group of memory cells containing 8KB of data, and assuming an intermediate read voltage of 3.75 V, a pass voltage of 5 V, a QLC sigma of 20 mV, and a charge loss effect of 0.75 mV±20 mV/time decade. From the raw data, either empirical or direct, a function could be determined for a memory array as a whole, or individual functions might be determined on some sub-portion of the memory array, e.g., by page or block of memory cells. Alternatively, one or more tables might be developed from the raw data, either for the memory array as a whole, or for individual sub-portions of the memory array, e.g., by page or block of memory cells.

Table 2 is an example of a table (e.g., a lookup table) that might be used to determine an expected data age from a number of memory cells activating in response to a particular intermediate read voltage, such as depicted in the example of FIG. 5. The information of Table 2 might be contained within the trim register 128, for example.

TABLE 2

| Activated Memory Cells (%) | Expected Data Age (Time Decades) |
|---|---|
| 87.5 | 0 |
| 88.8 | 1 |
| 91.5 | 2 |
| 93.0 | 3 |
| 93.7 | 4 |
| 94.1 | 5 |

Table 3 is another example of a table that might be used to determine an expected data age from a quantity (e.g., an integer value) of memory cells activating in response to a particular intermediate read voltage, such as depicted in the example of FIG. 5. The information of Table 3 might be contained within the trim register 128, for example.

TABLE 3

| Activated Memory Cells (Bytes) | Expected Data Age (Time Decades) |
|---|---|
| 7170 | 0 |
| 7275 | 1 |
| 7495 | 2 |
| 7620 | 3 |
| 7675 | 4 |
| 7710 | 5 |

Table 4 is an example of a table structure that might be used to determine desired read voltages in response to determining an expected data age of the group memory cells. The information of Table 4 might be contained within the trim register 128, for example.

TABLE 4

| Expected Data Age (Time Decades) | $RD_0$ ($432_0$) | $RD_1$ ($432_1$) | $RD_2 \ldots RD_{13}$ ($432_2$)    ($432_{13}$) | | $RD_{14}$ ($432_{14}$) |
|---|---|---|---|---|---|
| 0 | $RD_{0-0}$ | $RD_{1-0}$ | $RD_{2-0}$ | $\ldots RD_{13-0}$ | $RD_{14-0}$ |
| 1 | $RD_{0-1}$ | $RD_{1-1}$ | $RD_{2-1}$ | $\ldots RD_{13-1}$ | $RD_{14-1}$ |
| 2 | $RD_{0-2}$ | $RD_{1-2}$ | $RD_{2-2}$ | $\ldots RD_{13-2}$ | $RD_{14-2}$ |
| 3 | $RD_{0-3}$ | $RD_{1-3}$ | $RD_{2-3}$ | $\ldots RD_{13-3}$ | $RD_{14-3}$ |
| 4 | $RD_{0-4}$ | $RD_{1-4}$ | $RD_{2-4}$ | $\ldots RD_{13-4}$ | $RD_{14-4}$ |
| 5 | $RD_{0-5}$ | $RD_{1-5}$ | $RD_{2-5}$ | $\ldots RD_{13-5}$ | $RD_{14-5}$ |

Consider Table 4 in reference to the example of FIG. 4A. $R_{0-0}$ might correspond to the read voltage $432_0$ to be used at an expected data age of 0 time decades, $R_{0-1}$ might correspond to the read voltage $432_0$ to be used at an expected data age of 1 time decade, $RD_{0-2}$ might correspond to the read voltage $432_0$ to be used at an expected data age of 2 time decades, and so on. Similar correspondences can be made for the remaining read voltages $432_1$-$432_{14}$. For some embodiments, the values for the read voltage $432_0$ might remain constant for each time decade. In general, the values for the read voltages $430_1$-$432_{14}$ might be expected to decrease with increasing time decades. While the examples of Tables 2-4 depict only integer values of time decades, intermediate values might also be utilized, such as depicted in FIG. 5.

Table 5 is an example of a table structure that might be used to determine desired read voltages in response to the number of memory cells activating in response to applying the intermediate read voltage without first determining an expected data age of the group memory cells. The information of Table 5 might be contained within the trim register 128, for example.

TABLE 5

| Activated Memory Cells (%) | $RD_0$ ($432_0$) | $RD_1$ ($432_1$) | $RD_2$ ($432_2$) | ... | $RD_{13}$ ($432_{13}$) | $RD_{14}$ ($432_{14}$) |
|---|---|---|---|---|---|---|
| 87.5 | $RD_{0-1}$ | $RD_{1-1}$ | $RD_{2-1}$ | ... | $RD_{13-1}$ | $RD_{14-1}$ |
| 88.8 | $RD_{0-2}$ | $RD_{1-2}$ | $RD_{2-2}$ | ... | $RD_{13-2}$ | $RD_{14-2}$ |
| 91.5 | $RD_{0-3}$ | $RD_{1-3}$ | $RD_{2-3}$ | ... | $RD_{13-3}$ | $RD_{14-3}$ |
| 93.0 | $RD_{0-4}$ | $RD_{1-4}$ | $RD_{2-4}$ | ... | $RD_{13-4}$ | $RD_{14-4}$ |
| 93.7 | $RD_{0-5}$ | $RD_{1-5}$ | $RD_{2-5}$ | ... | $RD_{13-5}$ | $RD_{14-5}$ |
| 94.1 | $RD_{0-6}$ | $RD_{1-6}$ | $RD_{2-6}$ | ... | $RD_{13-6}$ | $RD_{14-6}$ |

In Table 5, $RD_{0-1}$ might correspond to the read voltage $432_0$ to be used when the value indicative of the number of activated memory cells has its first value (e.g., 87.5%), $RD_{0-2}$ might correspond to the read voltage $432_0$ to be used when the value indicative of the number of activated memory cells has its second value (e.g., 88.8%), $RD_{0-3}$ might correspond to the read voltage $432_0$ to be used when the value indicative of the number of activated memory cells has its third value (e.g., 91.5%), and so on. Similar correspondences can be made for the remaining read voltages $432_1$-$432_{14}$. For some embodiments, the values for the read voltage $432_0$ might remain constant for each value indicative of the number of activated memory cells. In general, the values for the read voltages $430_1$-$432_{14}$ might be expected to decrease with increasing time decades.

In using a lookup table, embodiments may seek to interpolate between values when no exact match exists. Alternatively, embodiments might select the value of the table that is closest to the determined value, e.g., the determined value indicative of a number of activated memory cells or the determined expected data age.

Figure 6:
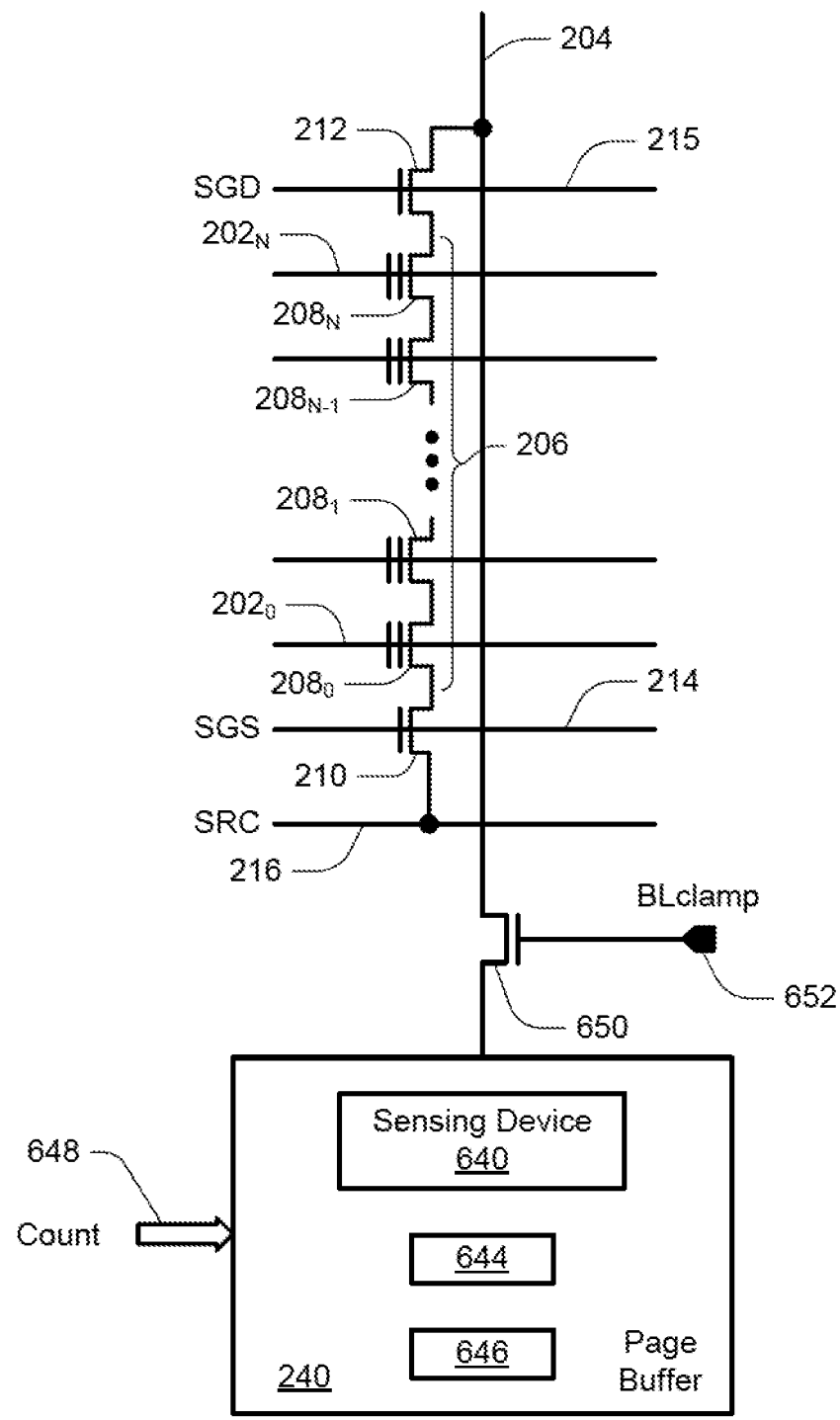
FIG. 6 is a block schematic depicting a connection of a data line to a sensing device and page buffer for use with various embodiments.

FIG. 6 is a block schematic depicting a connection of a data line to a page buffer and sensing device for use with various embodiments. In FIG. 6, a NAND string 206 is selectively connected to a data line 204 through a select gate 212, and to a source 216 through a select gate 210. The NAND string 206 might have the same structure as described with reference to FIG. 2A, having N+1 memory cells $208_0$-$208_N$. In reading the data state of one of the memory cells $208_0$-$208_N$, the select gates 210 and 212 might be activated, a read voltage might be applied to the access line (e.g., selected access line) connected to a memory cell selected for the read operation, e.g., a target memory cell, and a pass voltage might be applied to the access lines (e.g., unselected access lines) connected to remaining memory cells (e.g., each remaining memory cell) of the NAND string 206. For example, if the memory cell $208_1$ is selected for the read operation, it might receive the read voltage at its control gate, where that read voltage is configured to activate the memory cell $208_1$ if its data state corresponds to a threshold voltage that is lower than or equal to the read voltage, and to deactivate the memory cell $208_1$ if its data state corresponds to a threshold voltage that is higher than the read voltage. Each remaining memory cell 208 (e.g., memory cells $208_0$ and $208_2$-$208_N$) might receive a pass voltage at their control gates, where that pass voltage is configured to activate each of the remaining memory cells 208 regardless of their data state.

The state of the data line 204 might indicate whether the target memory cell $208_1$ is in a state of activation or deactivation because current flow between the data line 204 and the source 216 might be enabled or inhibited, respectively. This property can then be sensed by a sensing device 640 connected to (e.g., selectively connected to) the data line 204, such as through a measurement of current flow or a resulting voltage level, or a comparison of current flow or resulting voltage level to some threshold value, e.g., using a differential amplifier or the like. The output of the sensing device 640 might be used to set one or more registers of a page buffer 240. For example, a first register 644 might be a one-digit (e.g., one bit) register having a first value (e.g., first logic level) indicative of the target memory cell $208_1$ being deactivated, e.g., in response to a sensing by the sensing device 640 indicating that current flow between the data line 204 and the source 216 is inhibited. The register 644 might further have a second value (e.g., second logic level different than the first logic level) indicative of the target memory cell $208_1$ being activated, e.g., in response to a sensing by the sensing device 640 indicating that current flow between the data line 204 and the source 216 is enabled. The page buffer 240 might further include a second register 646 that might be a multi-digit (e.g., multi-bit) register. In response to a sensing by the sensing device 640 indicating that current flow between the data line 204 and the source 216 is enabled, the page buffer 240 might be configured (e.g., in response to toggling the value of the first register 644 to its second value) to latch a representation 648 of a voltage level into the register 646, e.g., a representation of a voltage level being applied to the selected access line $202_1$. In this manner, the register 646 might contain a representation of the threshold voltage of the target memory cell $208_1$, e.g., a representation of the voltage level at which the state of the data line 204 changed. Oftentimes, a counter and a digital-to-analog converter (DAC), not shown, are used to generate the voltage levels applied during a read operation, where a count of the counter might indicate the voltage level output from the DAC. In such a system, the count would thus represent the voltage level being applied.

Using the example of FIG. 6, the intermediate read voltage might be applied to the selected access line $202_1$. The data line 204 might be connected to the sensing device 640 upon activation of the transistor (e.g., n-type field effect transistor or nFET) 650, e.g., by applying a control signal BLclamp to control signal node 652 having a voltage level sufficient to activate the transistor 650. If the register 644 has its second logic level in response to the sensing of the state of the data line 204 by the sensing device 640, the memory cell $208_1$ might be counted as being activated. The structure of FIG. 6 might be repeated for each memory cell of the group of memory cells for which the determination of expected data age is to be performed, such that a number of registers 644 having their second logic level could indicate the number of activated memory cells of that group of memory cells. Alternatively, the number of deactivated memory cells might be determined to indicate a number of activated memory cells by subtracting the number of deactivated memory cells from a total number of memory cells.

Figure 7:
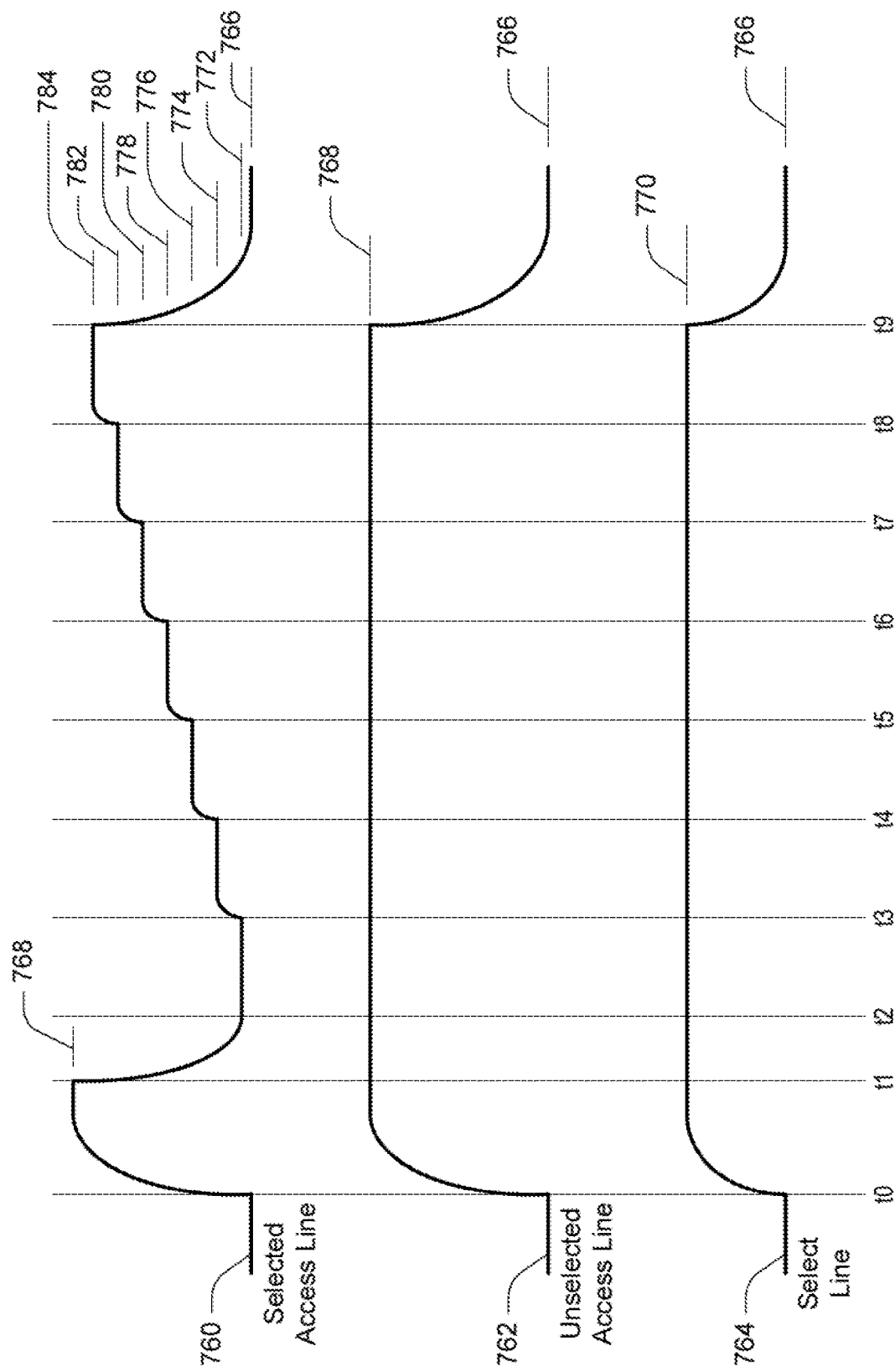
FIG. 7 depicts a timing diagram for a method of operating a memory for use with embodiments.

FIG. 7 depicts a timing diagram for a method of operating a memory in accordance with an embodiment. For example, the timing diagram of FIG. 7 might represent a read operation of a memory. Trace 760 might represent the voltage level applied to an access line connected to a memory cell selected for the read operation, e.g., a target memory cell. The following discussion will be made with reference to at least FIG. 2A and will presume that the memory cell selected for the read operation is the memory cell $208_x$ of the NAND string $206_0$, such that trace 760 might represent the voltage level applied to access line $202_x$. The access line $202_x$ may be referred to as the selected access line as it contains the target memory cell, while remaining access lines 202 may be referred to as unselected access lines. The NAND string $206_0$ may be referred to as the selected string of series-connected memory cells as it contains the target memory cell. Trace 762 might represent the voltage level applied to one or more of the unselected access lines 202, e.g., access lines $202_0$-$202_{x-1}$ and $202_{x+1}$-$202_N$. Trace 764 might represent the voltage level applied to the select line 214 and the voltage level applied to the select line 215.

At time t0, a precharge phase might begin. The precharge phase of the read operation might bring the unselected access lines 202 to a voltage level sufficient to activate their respective connected memory cells regardless of their data states, e.g., a pass voltage. As shown in the example of FIG. 7, the voltage levels of all access lines 202 of the block of memory cells containing the target memory cell (e.g., one or more target memory cells) are initially brought up to a voltage level 768. The voltage level 768 may be sufficient to activate each memory cell connected to one of the access lines 202 regardless of their data state. As one example, voltage level 768 might be 8 V. Bringing all of the access lines 202 up together in this manner may facilitate improvements in speed to steady state of any access line 202 whose desired voltage level is the voltage level 768. The select line 214 and the select line 215 might be brought up to a voltage level 774 sufficient to activate their respective select gates.

At or around time t1, the selected access line $202_x$ might be discharged to a voltage level 772. The voltage level 772 might represent a read voltage intended to distinguish between possible data states of the target memory cell. For example, if the target memory cell is activated while the voltage level 772 is applied to the access line $202_x$, and thus to the control gate of the target memory cell, it may be deemed to have a data state corresponding to a range of threshold voltages lower than or equal to the voltage level 772. If the target memory cell is deactivated while the voltage level 772 is applied to the access line $202_x$, it may be deemed to have a data state corresponding to a range of threshold voltages higher than the voltage level 772. A sensing operation might be performed while the voltage level 772 is being applied, as is well understood in the art. As one example, the voltage level 772 might correspond to the read voltage $430_0$. Although the voltage level 772 is depicted as being higher than the voltage level 766, the voltage level 772 might be a negative voltage level for some embodiments.

While the voltage level 772 is being applied to the selected access line $202_x$ at time t2, the voltage level 768 is being applied to the unselected access lines $202_0$-$202_{x-1}$ and $202_{x+1}$-$202_N$. The voltage level 768 is sufficient to activate the memory cells connected to these unselected access lines regardless of their data state. In addition, while the voltage level 772 is being applied to the selected access line $202_x$ at time t2, the voltage level 770 might be applied to the select line 214 and to the select line 215. The voltage level 770 might be sufficient to activate the select gates connected to these select lines. In this manner, current flow may be established through the NAND string 206 if the target memory cell is activated, thus permitting sensing of its data state. As one example, the voltage level 774 might be approximately 5 V.

At time t3, the voltage level applied to the selected access line $202_x$ might be increased to the voltage level 774 while voltage levels of the other traces 762 and 764 might be maintained. The voltage level 774 might represent a different read voltage intended to distinguish between different possible data states of the target memory cell. A sensing operation might be performed while the voltage level 774 is being applied, as is well understood in the art. As one example, the voltage level 774 might correspond to the read voltage $430_1$.

At time t4, the voltage level applied to the selected access line $202_x$ might be increased to the voltage level 776 while voltage levels of the other traces 762 and 764 might be maintained. The voltage level 776 might represent a different read voltage intended to distinguish between different possible data states of the target memory cell. A sensing operation might be performed while the voltage level 776 is being applied, as is well understood in the art. As one example, the voltage level 776 might correspond to the read voltage $430_2$.

At time t5, the voltage level applied to the selected access line $202_x$ might be increased to the voltage level 778 while voltage levels of the other traces 762 and 764 might be maintained. The voltage level 778 might represent a different read voltage intended to distinguish between different possible data states of the target memory cell. A sensing operation might be performed while the voltage level 778 is being applied, as is well understood in the art. As one example, the voltage level 778 might correspond to the read voltage $430_3$.

At time t6, the voltage level applied to the selected access line $202_x$ might be increased to the voltage level 780 while voltage levels of the other traces 762 and 764 might be maintained. The voltage level 780 might represent a different read voltage intended to distinguish between different possible data states of the target memory cell. A sensing operation might be performed while the voltage level 780 is being applied, as is well understood in the art. As one example, the voltage level 780 might correspond to the read voltage $430_4$.

At time t7, the voltage level applied to the selected access line $202_x$ might be increased to the voltage level 782 while voltage levels of the other traces 762 and 764 might be maintained. The voltage level 782 might represent a different read voltage intended to distinguish between different possible data states of the target memory cell. A sensing operation might be performed while the voltage level 782 is being applied, as is well understood in the art. As one example, the voltage level 782 might correspond to the read voltage $430_5$.

At time t8, the voltage level applied to the selected access line $202_x$ might be increased to the voltage level 784 while voltage levels of the other traces 762 and 764 might be maintained. The voltage level 784 might represent a different read voltage intended to distinguish between different possible data states of the target memory cell. A sensing operation might be performed while the voltage level 784 is being applied, as is well understood in the art. As one example, the voltage level 784 might correspond to the read voltage 430₆.

While only seven read voltages are depicted in FIG. 7, other numbers of read voltages might be used. In general, Y read voltages might be used to distinguish between each of Y+1 possible data states. At time t9, all of the lines might be discharged to the voltage level 766, which might be a reference potential, e.g., ground or 0V. The period between time t2 and t9, for each read voltage of the read operation, might correspond to a sensing phase of the read operation when the data states of one or more target memory cells are sensed.

Figure 8:
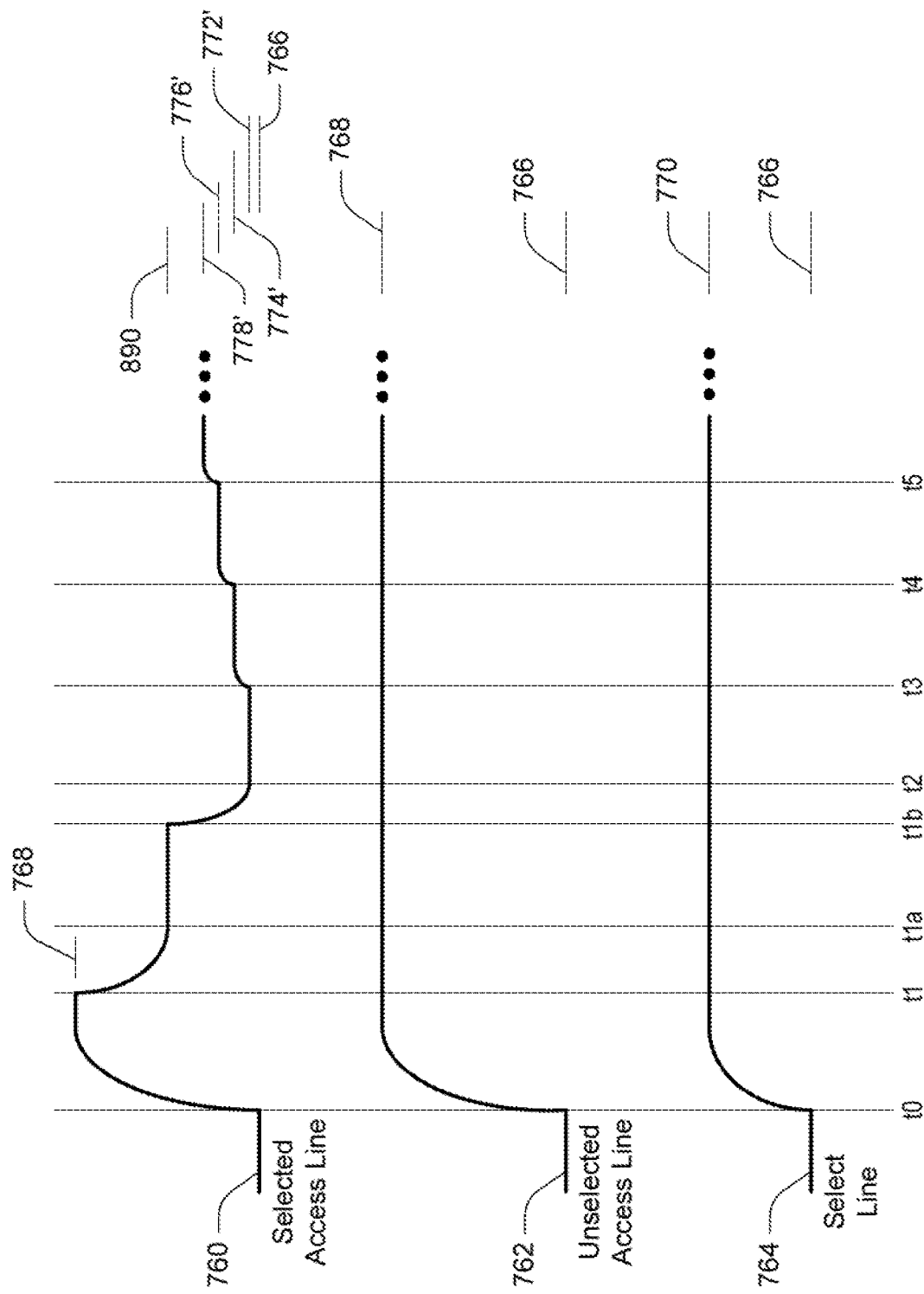
FIG. 8 depicts a timing diagram for a method of operating a memory in accordance with an embodiment.

To determine the read voltages to be utilized during a read operation, an expected data age of the memory cells selected for the read operation might be determined, either prior to, or during, the read operation to sense the data states. FIG. 8 depicts a timing diagram for a method of operating a memory in accordance with an embodiment that addresses such a determination of expected data age.

At time t0, a precharge phase might begin, as described with reference to FIG. 7. At or around time t1, the selected access line 202$_x$ might be discharged to a voltage level 890. The voltage level 890 might represent the intermediate read voltage, e.g., intermediate read voltage 436. For example, if the target memory cell is activated while the voltage level 890 is applied to the access line 202$_x$, and thus to the control gate of the target memory cell, it might be counted in the number of memory cells activated in response to the intermediate read voltage. If the target memory cell is deactivated while the voltage level 890 is applied to the access line 202$_x$, it might not be counted in the number of memory cells activated in response to the intermediate read voltage. A sensing operation might be performed while the voltage level 890 is being applied, as is well understood in the art.

While the voltage level 890 is being applied to the selected access line 202$_x$ at time t1*a*, the voltage level 768 might be applied to the unselected access lines 202$_0$-202$_{x-1}$ and 202$_{x+1}$-202$_N$ as described with reference to FIG. 7. In addition, while the voltage level 890 is being applied to the selected access line 202$_x$ at time t2, the voltage level 770 might be applied to the select line 214 and to the select line 215 as described with reference to FIG. 7. A sensing operation might be performed while the voltage level 890 is being applied, as is well understood in the art, to determine whether the target memory cell 208$_x$ is activated in response to the voltage level 890. If the target memory cell 208$_x$ is activated, the register 644 might latch its second logic level, and if the target memory cell 208$_x$ is deactivated, the register 644 might retain its first logic level.

The number of memory cells activated in response to applying the voltage level 890 might be counted, e.g., a sum of the registers 644 having their second logic level (e.g., logic high level) might be performed. This detected number of memory cells, whether expressed as a quantity, fraction or percentage, might then be used to determine an expected data age of the group of memory cells as previously described. In response to a determination of the expected data age, a set of read voltages to be used in sensing the data states of the memory cells might then be determined. The process could end at time t1*b*, with the traces 760, 762 and 764 being discharged to the voltage level 766, and the read operation for those memory cells could be subsequently performed such as described with reference to FIG. 7.

Alternatively, the process could continue directly to the read operation at time t1*b* with the selected access line 202$_x$ being discharged to the voltage level 772', e.g., corresponding to the read voltage 430$_0$ at the determined expected data age. The processing from time t2 and beyond might proceed as described with reference to FIG. 7 with the exception that each of the subsequent voltage levels 774', 776', 778', etc., might represent their respective read voltages 432 at the determined data age. The register 644 might be reset prior to discharging the selected access line 202$_x$, e.g., to prepare the register for use in determining the data state of the target memory cell 208$_x$ in response to the applied read voltages.

Figure 9:
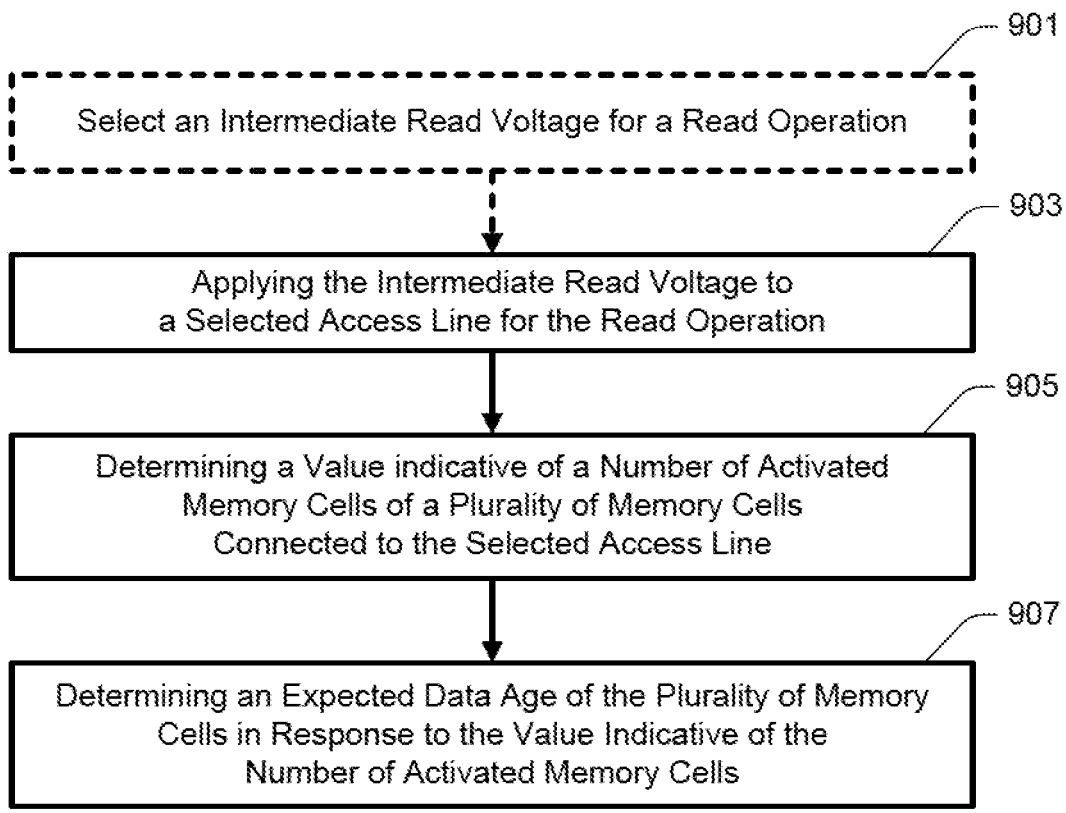
FIG. 9 is a flowchart of a method of operating a memory in accordance with an embodiment.

FIG. 9 is a flowchart of a method of operating a memory in accordance with an embodiment. For example, the method of FIG. 9 might be a portion of a read operation, or might be performed prior to (e.g., immediately prior to) a read operation. At 901, an intermediate read voltage might be selected. The intermediate read voltage might have a voltage level within an initial read window for a group of memory cells. For some embodiments, the intermediate read voltage might be predetermined, and a representation of the intermediate read voltage might be contained within the trim register 128, for example.

At 903, the intermediate read voltage might be applied to an access line selected for a read operation. While the intermediate read voltage is applied to the selected access line, unselected access lines and select gates might be activated. At 905, a value indicative of a number of activated memory cells of a plurality of memory cells connected to the selected access line might be determined, e.g., through sensing whether memory cells of the plurality of memory cells are activated or deactivated. At 907, the expected data age of the plurality of memory cells might be determined in response to the value indicative of the number of activated memory cells, whether the value indicating the number of activated memory cells is represented by a quantity, fraction, percentage or otherwise.

Figure 10:
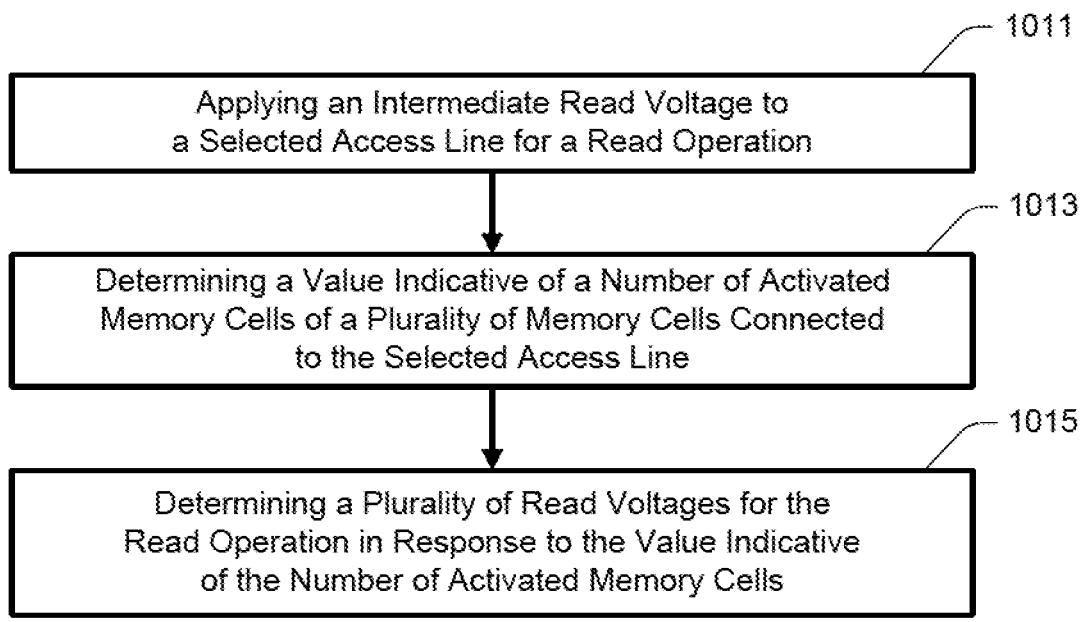
FIG. 10 is a flowchart of a method of operating a memory in accordance with another embodiment.

FIG. 10 is a flowchart of a method of operating a memory in accordance with another embodiment. For example, the method of FIG. 10 might be a portion of a read operation. At 1011, an intermediate read voltage might be applied to an access line selected for a read operation. While the intermediate read voltage is applied to the selected access line, unselected access lines and select gates might be activated. The intermediate read voltage might be selected, or predetermined, as discussed with reference to FIG. 9.

At 1013, a value indicative of a number of activated memory cells of a plurality of memory cells connected to the selected access line might be determined, e.g., through sensing whether memory cells of the plurality of memory cells are activated or deactivated. At 1015, a plurality of read voltages for the read operation might be determined in response to the value indicative of the number of activated memory cells. For example, the expected data age of the plurality of memory cells might be determined in response to the determined value indicative of the number of activated memory cells, whether the value indicating the number of activated memory cells is represented by a quantity, fraction, percentage or otherwise, and the plurality of read voltages might be determined in response to the expected data age of the plurality of memory cells.

Figure 11:
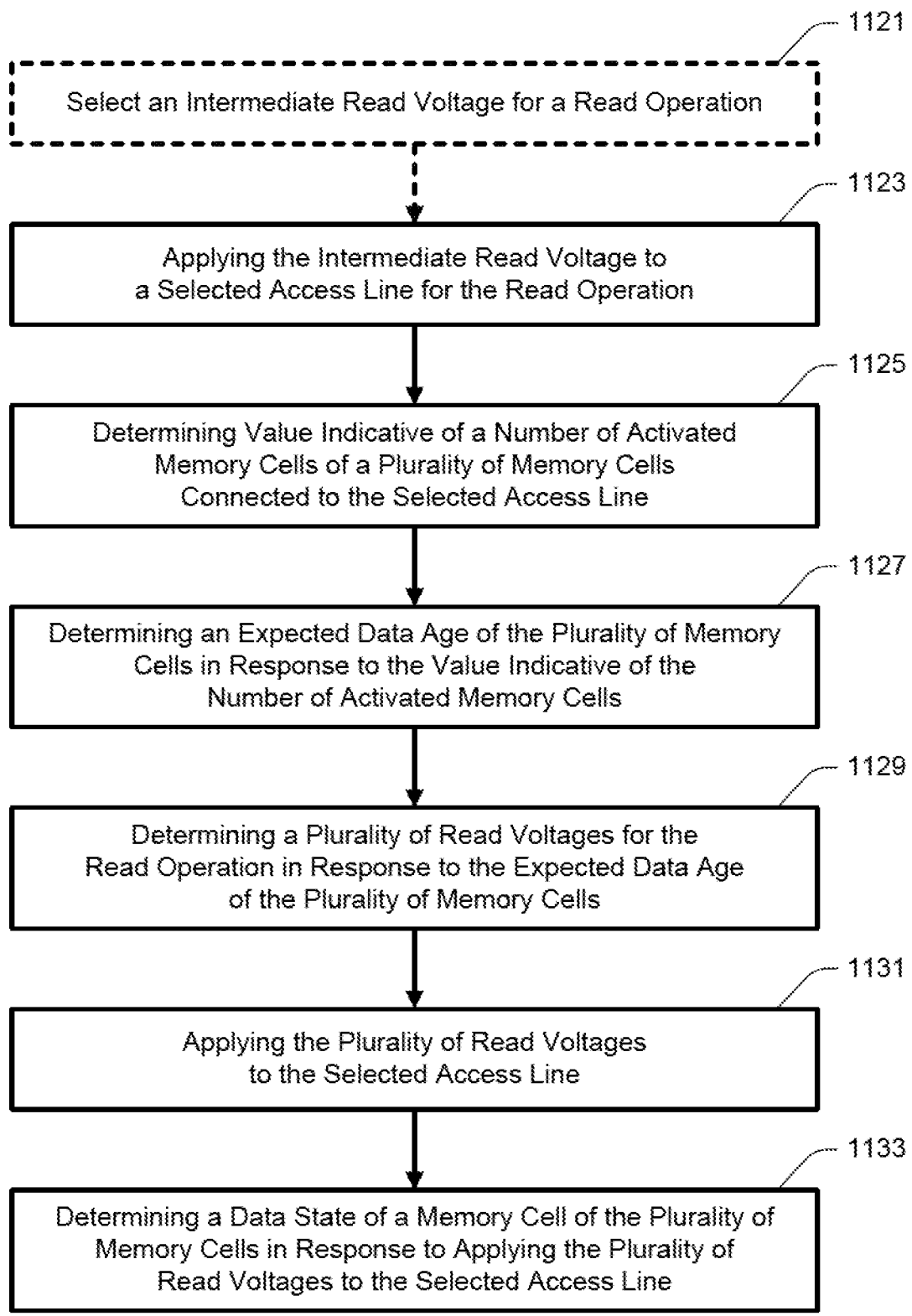
FIG. 11 is a flowchart of a method of operating a memory in accordance with a further embodiment.

FIG. 11 is a flowchart of a method of operating a memory in accordance with a further embodiment. For example, the method of FIG. 11 might be a portion of a read operation. At 1121, an intermediate read voltage might be selected. The intermediate read voltage might have a voltage level within an initial read window for a group of memory cells. For some embodiments, the intermediate read voltage might be predetermined, and a representation of the intermediate read voltage might be contained within the trim register 128, for example.

At 1123, the intermediate read voltage might be applied to an access line selected for a read operation. While the intermediate read voltage is applied to the selected access line, unselected access lines and select gates might be activated. At 1125, a value indicative of a number of activated memory cells of a plurality of memory cells connected to the selected access line might be determined, e.g., through sensing whether memory cells of the plurality of memory cells are activated or deactivated. At 1127, the expected data age of the plurality of memory cells might be determined in response to the value indicative of the number of activated memory cells, whether the value indicating the number of activated memory cells is represented by a quantity, fraction, percentage or otherwise.

At 1129, a plurality of read voltages for the read operation might be determined in response to the expected data age of the plurality of memory cells. At 1131, the plurality of read voltages might be applied to the selected access line, e.g., sequentially from a lowest read voltage of the plurality of read voltages to a highest read voltage of the plurality of read voltages. While the plurality of read voltages are applied to the selected access line, unselected access lines and select gates might be activated. At 1133, the data state of a memory cell (e.g., each memory cell) of the plurality of memory cells might be determined in response to applying the plurality of read voltages to the selected access line. For some embodiments, the plurality of memory cells might include each memory cell connected to the selected access line. For other embodiments, the plurality of memory cells might include a subset (e.g., proper subset) of the memory cells connected to the selected access line, e.g., every other memory cell (e.g., even memory cells or odd memory cells) connected to the selected access line.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
  an array of memory cells;
  a plurality of access lines, each access line of the plurality of access lines corresponding to a respective plurality of memory cells of the array of memory cells, wherein each access line of the plurality of access lines is connected to a control gate of each memory cell of its respective plurality of memory cells; and
  a controller for access of the array of memory cells, wherein the controller is configured to cause the apparatus to:
    apply a particular voltage level to a particular access line of the plurality of access lines;
    determine a value indicative of a number of memory cells of the respective plurality of memory cells for the particular access line that are activated in response to applying the particular voltage level to the particular access line; and
    determine an expected data age of the respective plurality of memory cells for the particular access line in response to the value indicative of the number of memory cells of the respective plurality of memory cells for the particular access line that are activated in response to applying the particular voltage level to the particular access line.

2. The apparatus of claim 1, further comprising:
  selecting the particular voltage level to have a voltage level higher than a lowest read voltage for the read operation at a particular data age and lower than a highest read voltage for the read operation at the particular data age.

3. The apparatus of claim 2, wherein the particular data age is immediately subsequent to programming.

4. The apparatus of claim 1, wherein the controller being configured to determine the value indicative of the number of memory cells of the respective plurality of memory cells for the particular access line that are activated in response to applying the particular voltage level to the particular access line comprises the controller being configured to determine a second value indicative of a number of memory cells of the respective plurality of memory cells for the particular access line that are deactivated in response to applying the particular voltage level to the particular access line, and subtracting the second value from a number of memory cells in the respective plurality of memory cells for the particular access line.

5. The apparatus of claim 1, wherein the controller being configured to determine the value indicative of the number of memory cells of the respective plurality of memory cells for the particular access line that are activated in response to applying the particular voltage level to the particular access line comprises the controller being configured to determine a value represented in a manner selected from a group consisting of a quantity of memory cells of the respective plurality of memory cells for the particular access line, a fraction of memory cells of the respective plurality of memory cells for the particular access line, and a percentage of memory cells of the respective plurality of memory cells for the particular access line.

6. The apparatus of claim 1, wherein the controller being configured to determine the expected data age of the respective plurality of memory cells for the particular access line in response to the value indicative of the number of memory cells of the respective plurality of memory cells for the particular access line that are activated in response to applying the particular voltage level to the particular access line comprises the controller being configured to use a lookup table indicative of a relationship between expected data ages and numbers of memory cells activated in response to applying the particular voltage level.

7. The apparatus of claim 6, wherein the controller being configured to use the lookup table comprises the controller being configured to interpolate the expected data age from a first value of the expected data age at a first value indicative of the number of memory cells of the respective plurality of memory cells for the particular access line that are activated, and from a second value of the expected data age at a second value indicative of the number of memory cells of the respective plurality of memory cells for the particular access line that are activated.

8. The apparatus of claim 6, wherein the controller being configured to use the lookup table comprises the controller being configured to determine the expected data age using a table entry that is closest to the value indicative of the number of memory cells of the respective plurality of memory cells for the particular access line that are activated in response to applying the particular voltage level to the particular access line.

9. The apparatus of claim 1, wherein the controller being configured to determine the expected data age comprises the controller being configured to determine the expected data age represented as a time decade, and wherein X time decades equals $10^x$ seconds, with X having a value greater than or equal to zero.

10. An apparatus, comprising:
an array of memory cells;
a plurality of access lines, each access line of the plurality of access lines corresponding to a respective plurality of memory cells of the array of memory cells, wherein each access line of the plurality of access lines is connected to a control gate of each memory cell of its respective plurality of memory cells; and
a controller for access of the array of memory cells, wherein the controller is configured to cause the apparatus to:
apply an particular voltage level to a particular access line, of the plurality of access lines, selected for a read operation;
determine a value indicative of a number of memory cells of a respective plurality of memory cells for the particular access line connected to the particular access line that are activated in response to applying the particular voltage level to the particular access line; and
determine a plurality of read voltages for the read operation in response to the value indicative of the number of memory cells of the respective plurality of memory cells for the particular access line that are activated in response to applying the particular voltage level to the particular access line.

11. The apparatus of claim 10, wherein a read window corresponding to the plurality of read voltages is smaller than an initial read window of the read operation.

12. The apparatus of claim 11, wherein the particular voltage level is a voltage level within an upper quarter of the initial read window of the read operation.

13. The apparatus of claim 10, wherein the controller being configured to apply the particular voltage level to the particular access line selected for the read operation comprises the controller being configured to apply a voltage level that is within an initial read window of the read operation.

14. The apparatus of claim 13, wherein the controller being configured to apply the voltage level that is within the initial read window of the read operation comprises the controller being configured to apply a voltage level that is within an upper half of the initial read window.

15. The apparatus of claim 13, wherein the controller being configured to apply the voltage level that is within the initial read window of the read operation comprises the controller being configured to apply a voltage level that is within a range of a lowest voltage level of the initial read window plus 0.70-0.95 times a width of the initial read window.

16. The apparatus of claim 10, wherein the controller being configured to determine the plurality of read voltages for the read operation in response to the value indicative of the number of memory cells of the respective plurality of memory cells for the particular access line that are activated in response to applying the particular voltage level to the particular access line comprises the controller being configured to determine an expected data age of the respective plurality of memory cells for the particular access line in response to the value indicative of the number of memory cells of the respective plurality of memory cells for the particular access line that are activated in response to applying the particular voltage level to the particular access line, and to determine the plurality of read voltages for the read operation in response to the expected data age of the respective plurality of memory cells for the particular access line.

17. An apparatus, comprising:
an array of memory cells;
a plurality of access lines, each access line of the plurality of access lines corresponding to a respective plurality of memory cells of the array of memory cells, wherein each access line of the plurality of access lines is connected to a control gate of each memory cell of its respective plurality of memory cells; and
a controller for access of the array of memory cells, wherein the controller is configured to cause the apparatus to:
apply a particular voltage level to a particular access line, of the plurality of access lines, selected for a read operation;
determine a value indicative of a number of memory cells of the respective plurality of memory cells for the particular access line that are activated in response to applying the particular voltage level to the particular access line;
determine an expected data age of the respective plurality of memory cells for the particular access line in response to the value indicative of the number of memory cells of the respective plurality of memory cells for the particular access line that are activated in response to applying the particular voltage level to the particular access line;
determine a plurality of read voltages for the read operation in response to the expected data age of the respective plurality of memory cells for the particular access line;
apply the plurality of read voltages to the particular access line; and
determine a data state of a particular memory cell of the respective plurality of memory cells for the particular access line in response to applying the plurality of read voltages to the particular access line.

18. The apparatus of claim 17, wherein the controller is further configured to determine a respective data state of each memory cell of at least one additional memory cell of the respective plurality of memory cells for the particular access line in response to applying the plurality of read voltages to the particular access line.

19. The apparatus of claim 17, wherein the controller being configured to determine the value indicative of the number of memory cells of the respective plurality of memory cells for the particular access line that are activated in response to applying the particular voltage level to the particular access line comprises the controller being configured to count a number of registers of a page buffer connected to the respective plurality of memory cells for the particular access line that indicate detection of an activated memory cell.

20. The apparatus of claim 17, further comprising:
if the particular memory cell, in response to applying the plurality of read voltages to the particular access line in an order of increasing voltage levels, activates for a first time when applying an Nth read voltage of the plurality of read voltages, the controller is further configured to determine the particular memory cell to have an Nth data state of a plurality of data states arranged in an order of increasing threshold voltage ranges.

21. The apparatus of claim 20, wherein the controller is further configured to use error correction to change the determined data state of the particular memory cell if an error is detected.

22. The apparatus of claim 21, wherein the controller being configured to use error correction to change the determined data state of the particular memory cell comprises the controller being configured to change the determined data state of the particular memory cell to a next lower data state of the plurality of data states arranged in the order of increasing threshold voltage ranges or to a next higher data state of the plurality of data states arranged in the order of increasing threshold voltage ranges.

23. The apparatus of claim 20, further comprising:
if the particular memory cell, in response to applying the plurality of read voltages to the particular access line in the order of increasing voltage levels, does not activate in response to any read voltage of the plurality of read voltages, the controller is further configured to determine the particular memory cell to have a highest data state of the plurality of data states arranged in the order of increasing threshold voltage ranges.

24. The apparatus of claim 17, wherein the controller being configured to apply the plurality of read voltages to the particular access line comprises the controller being configured to apply the plurality of read voltages to the particular access line in an order of increasing voltage levels.

25. The apparatus of claim 24, wherein the controller being configured to apply the particular voltage level to the particular access line comprises the controller being configured to apply a voltage level to the particular access line that is higher than a first read voltage of the plurality of read voltages in the order of increasing voltage levels, and that is lower than a last read voltage of the plurality of read voltages in the order of increasing voltage levels.

26. The apparatus of claim 17, wherein the controller being configured to determine the value indicative of the number of memory cells of the respective plurality of memory cells for the particular access line connected to the particular access line that are activated in response to applying the particular voltage level to the particular access line comprises a plurality of memory cells storing a pseudo-random distribution of data states of a plurality of data states.

* * * * *